US012791629B2

(12) United States Patent
Arinus

(10) Patent No.: US 12,791,629 B2
(45) Date of Patent: Nov. 10, 2026

(54) ELECTRICAL COMPONENT DIAGNOSTIC TOOL

(71) Applicant: David Arinus, Valley Stream, NY (US)

(72) Inventor: David Arinus, Valley Stream, NY (US)

( * ) Notice: Subject to any disclaimer, the term of this patent is extended or adjusted under 35 U.S.C. 154(b) by 118 days.

(21) Appl. No.: 18/742,333

(22) Filed: Jun. 13, 2024

(65) Prior Publication Data

US 2024/0418796 A1 Dec. 19, 2024

Related U.S. Application Data

(60) Provisional application No. 63/472,679, filed on Jun. 13, 2023.

(51) Int. Cl.
*G01R 31/56* (2020.01)

(52) U.S. Cl.
CPC .................................... *G01R 31/56* (2020.01)

(58) Field of Classification Search
CPC ...................................................... G01R 31/56
USPC .......................................................... 324/555
See application file for complete search history.

(56) References Cited

U.S. PATENT DOCUMENTS

| | | | | |
|---|---|---|---|---|
| 3,972,471 | A | 8/1976 | Ziegler | |
| 5,803,603 | A | 9/1998 | Schlueter | |
| 7,079,040 | B2 | 7/2006 | Barton | |
| 9,054,515 | B2 | 6/2015 | Barrenscheen | |
| 9,385,351 | B2 | 7/2016 | Workman et al. | |
| 9,568,227 | B2 | 2/2017 | Douglas et al. | |
| 9,784,780 | B2 | 10/2017 | Loftus et al. | |
| 10,197,612 | B2 | 2/2019 | Griffiths et al. | |
| 10,274,945 | B2 | 4/2019 | Arensmeier et al. | |
| 10,720,614 | B2 | 7/2020 | Roddy | |
| 2003/0085621 | A1* | 5/2003 | Potega .................... | H02J 9/061 307/18 |
| 2007/0194942 | A1* | 8/2007 | Darr ........................ | H02H 3/042 340/635 |
| 2012/0023994 | A1 | 2/2012 | Powell | |
| 2012/0200299 | A1* | 8/2012 | Stanton .............. | G01R 1/06788 324/508 |
| 2015/0333666 | A1 | 11/2015 | Miller et al. | |
| 2016/0204617 | A1* | 7/2016 | Gilbert ..................... | G01R 1/22 73/865.9 |
| 2016/0235981 | A1* | 8/2016 | Southwell .......... | A61N 1/36007 |
| 2016/0274179 | A1 | 9/2016 | Barton | |
| 2017/0126036 | A1* | 5/2017 | Dulle .................... | B60L 3/0046 |

(Continued)

*Primary Examiner* — Huy Q Phan
*Assistant Examiner* — Trung Q Nguyen
(74) *Attorney, Agent, or Firm* — SHERIDAN ROSS P.C.

(57) ABSTRACT

Systems and methods for a diagnostic tool are provided. The diagnostic tool enables an operator to test the functionality of electrical components, such as those found in low voltage HVAC systems. In some cases, the diagnostic tool includes an illumination component and a set of test leads that can be used to energize coils found in contactors, relay, solenoids, reversing, valves, etc. In one case, the diagnostic tool can be connected to a low voltage side, such as a control side, of a compressor contactor and may energize the compressor contactor to see if the compressor functions. The diagnostic tool may be actuated manually by depressing a constant switch to an "on" position or alternatively by temporarily holding an intermittent switch in an "on" position while the constant switch is in an "off" position. The diagnostic tool may be actuated wirelessly via a device pairing technology such as Bluetooth®.

19 Claims, 4 Drawing Sheets

(56) References Cited

U.S. PATENT DOCUMENTS

| | | | |
|---|---|---|---|
| 2021/0005410 A1 | 1/2021 | Nguyen et al. | |
| 2021/0215761 A1 | 7/2021 | Hsiao et al. | |
| 2022/0214374 A1* | 7/2022 | Kraft .................... | G01R 1/0416 |
| 2022/0214405 A1* | 7/2022 | Kim ................... | G01R 31/3842 |

* cited by examiner

ELECTRICAL COMPONENT DIAGNOSTIC TOOL

CROSS-REFERENCE TO RELATED APPLICATION

This application claims the benefit of and priority to U.S. Provisional Application No. 63/472,679 filed Jun. 13, 2023, the entire disclosure of which is incorporated herein by reference.

SUMMARY

The present disclosure is generally directed to electronic component diagnosis and, in particular, toward systems, methods, and devices for diagnosing functionality of electrical components, circuits, systems, and/or sub-systems.

To assist with more fully understanding the technology of this application, the following patents and patent publications are in incorporated herein by reference in their entireties: U.S. Pat. No. 3,972,471 to Ziegler; U.S. Pat. No. 5,803,603 to Schlueter; U.S. Pat. No. 7,079,040 to Barton; U.S. Pat. No. 9,054,515 to Barrenscheen; U.S. Pat. No. 9,385,351 to Workman et al.; U.S. Pat. No. 9,568,227 to Douglas et al.; U.S. Pat. No. 9,784,780 to Loftus et al.; U.S. Pat. No. 10,197,612 to Griffiths et al.; U.S. Pat. No. 10,274,945 to Arensmeier et al.; U.S. Pat. No. 10,720,614 to Roddy; U.S. Patent Publication No. 2012/0023994 to Powell; U.S. Patent Publication No. 2015/0333666 to Miller et al.; U.S. Patent Publication No. 2016/0274179 to Barton; U.S. Patent Publication No. 2021/0005410 to Nguyen et al.; and U.S. Patent Publication No. 2021/0215761 to Hsiao et al.

DETAILED DESCRIPTION

Embodiments of the present disclosure will be described in connection with a diagnostic tool for electrical components.

Figure 1A:
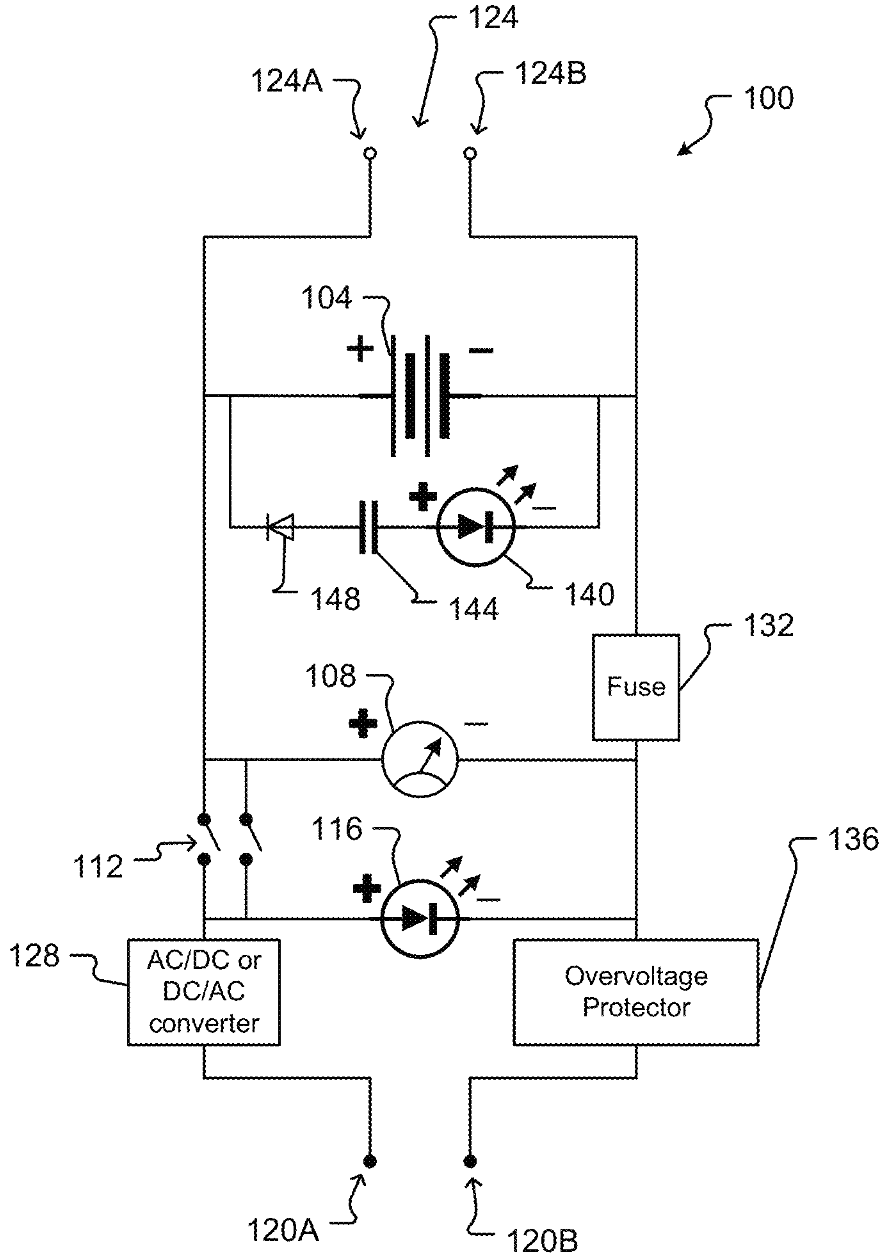
FIG. 1A shows a circuit diagram of a diagnostic tool in accordance with embodiments of the present disclosure.
Figure 1B:
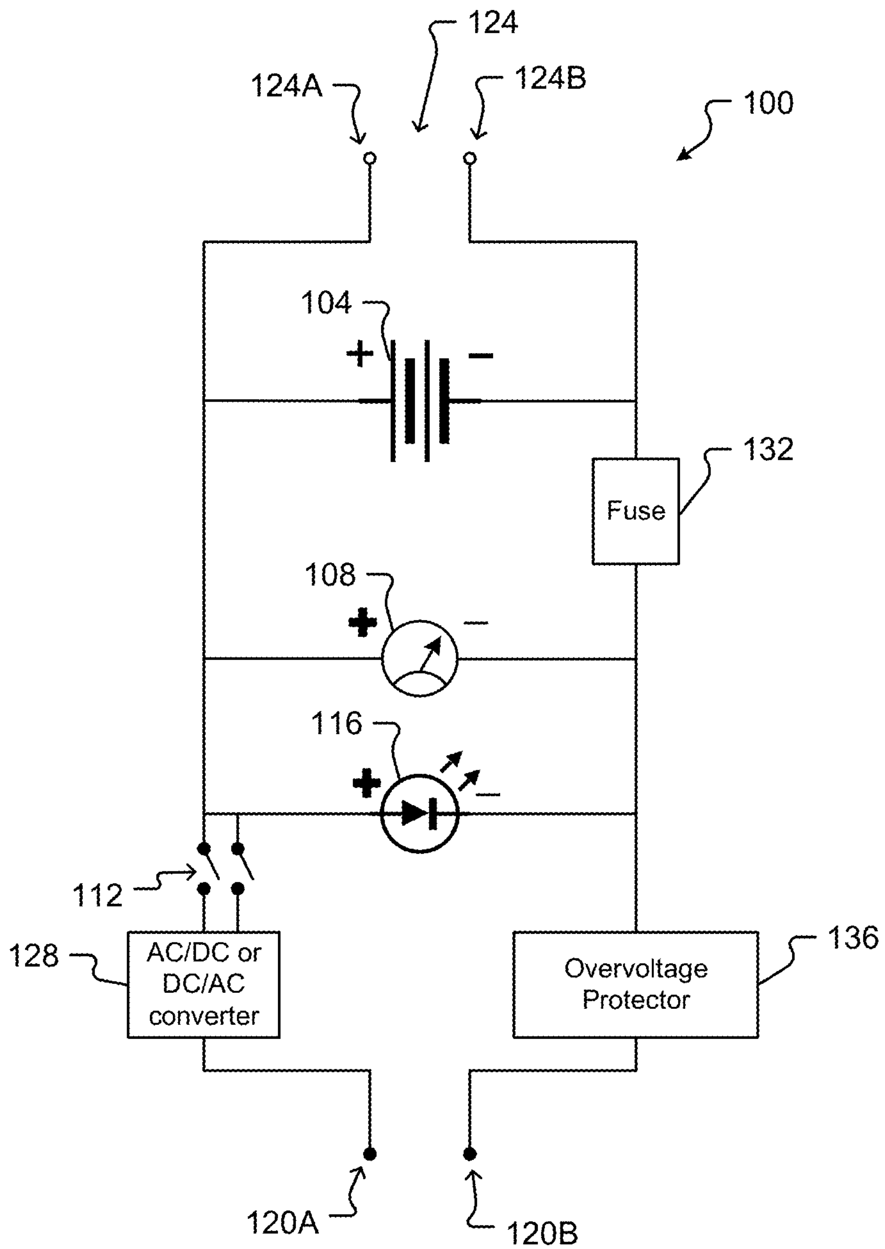
FIG. 1B shows a circuit diagram of a diagnostic tool in accordance with embodiments of the present disclosure.

FIGS. 1A-1B each depict exemplary circuit diagrams of a diagnostic tool 100 according to embodiments of the present disclosure. The diagnostic tool 100 comprises a battery pack 104 (or other power source, e.g., solar cells, DC input, or the like), a battery meter 108, a rocker switch 112, a Light Emitting Diode (LED) 116, a positive test lead 120A, a negative test lead 120B, and a charging port 124. It is to be understood that the diagnostic tool 100 may comprise additional or alternative components than those depicted in FIGS. 1A-1B. For example, the diagnostic tool 100 may comprise one or more other electrical components, such as one or more batteries or other power sources, resistors, replaceable fuses, switches, capacitors, inductors, transformers, liquid-crystal displays (LCDs), breakers, resettable fuses, and/or the like.

The battery pack 104 may be or comprise a number of batteries or other electrical energy storage devices capable of generating a current flow through one or more portions of the diagnostic tool 100. The battery pack 104 may house one, two, three, four, five, six, seven, eight, or more batteries. Each battery in the battery pack 104 may supply a predetermined or adjustable voltage, such that the battery pack 104 can supply a voltage of up to the sum of the individual voltages of each battery in the battery pack 104. For example, the battery pack 104 may comprise six batteries with each battery supplying 3.7 volts. As a result, the battery pack 104 can output up to about 22 volts (such as when the batteries are wired in series). The battery pack 104 may generate direct current or alternating current. In some embodiments, the batteries of the battery pack 104 comprise Lithium-ion batteries, while in other embodiments the battery pack 104 may use different battery types (e.g., Nickel Cadmium batteries, Alkaline batteries, etc.).

In some cases, the voltage of the battery pack 104 (or other power source) may be adjustable such that the output voltage of the diagnostic tool 100 can match or approximately match the operating voltage requirements of the equipment or electrical component to be tested. The voltage of the battery pack 104 may be adjustable via a dial, switch, or other user input device that enables the user to change the voltage output by the diagnostic tool 100. For example, the battery pack 104 may comprise 9 batteries each supplying 3.7 volts, and the user may be able to actuate one or more switches to electrically connect additional batteries to increase the output voltage (up to 33.3 volts in this example) and/or to electrically disconnect batteries to decrease the output voltage (down to 3.7 volts in this example). In examples where the components to be tested are part of a Heating, Ventilation, and Air Conditioning (HVAC) system and operate at or near 24 volts, and the battery pack 104 may be adjustable to output about 24 volts (e.g., by electrically connecting six or seven batteries such that the battery pack 104 outputs 22.2 volts or 25.9 volts, respectively). In some examples, the diagnostic tool 100 may include a dial (not shown) that enables the user to switch the battery pack 104 to output 24 volts. In some examples, the battery pack 104 may comprise a power source with an adjustable internal voltage, and the diagnostic tool 100 may include a dial that enables the user to change the internal voltage of the power source such that the output voltage of the diagnostic tool 100 is about 24 volts.

It is to be understood that, as used herein and unless otherwise specified, the output voltage of the battery pack 104 may meet or match the operating voltage of the electrical component to be tested when the output voltage falls within the tolerance of the operating voltage of the electrical component. For example, if the electrical component has an operating voltage of 24 volts with a tolerance of three volts (e.g., the electrical component can tolerate a voltage as low as 21 volts and as high as 27 volts), then the output voltage of diagnostic tool 100 may match or meet the operating voltage of the electrical component when the battery pack 104 outputs a voltage between and including 21 volts and 27 volts. In some cases, the battery pack 104 may comprise a fixed voltage based on the total number of batteries or other power sources present in the battery pack 104. For example, the battery pack 104 may comprise six batteries with each battery providing about 3 V, such that the fixed voltage of the battery pack 104 is about 18 V. The battery pack 104 may comprise a single battery pack, multiple battery packs, and/or any other power source.

In some cases, the battery pack 104 may comprise a removable, modular power supply of lithium-ion batteries or other similar power supply. In these cases, the diagnostic tool 100 may comprise one or more ports or other structures into which an alternative power supply can be connected to provide voltage to the diagnostic tool 100 and/or components thereof. In one example, the diagnostic tool 100 may be compatible with power sources such as battery packs from other tools (e.g., drills, flashlights, gauges, compressors, etc.). In other words, an operator of the diagnostic tool 100 can replace the battery pack 104 with batteries or a battery pack from another tool on a job site without needing to wait to recharge the battery pack 104.

The battery pack 104 may be connected to the battery meter 108, which provides an indicator of the charge left in the battery pack 104. In some embodiments, the battery pack 104 may be rechargeable such that, when the battery meter 108 indicates that the charge of the battery pack 104 is low, the battery pack 104 can be connected to an external charging system via the charging port 124. The charging port 124 of the diagnostic tool 100 comprises a positive lead 124A and a negative lead 124B that are respectively connected to the positive terminal and the negative terminal of the battery pack 104. The positive lead 124A and the negative lead 124B can be connected to the external charging system to charge the battery pack 104 (or, more specifically, to charge the one or more batteries in the battery pack 104). Once the battery pack 104 is charged, the positive lead 124A and the negative lead 124B can be disconnected from the external charging system.

The rocker switch 112 is connected to the positive terminal of the battery pack 104, and provides a circuit break in the diagnostic tool 100 to enable a user to selectively regulate the current flowing from the battery pack 104. In other words, the rocker switch 112 is movable between an "on" position and an "off" position. When the rocker switch 112 is in an "off" position, the path of current flow in the diagnostic tool 100 is partially or completely disconnected, such that current does not flow through the diagnostic tool 100, or alternatively such that current flows through only a portion of the diagnostic tool 100. When the rocker switch 112 is moved into an "on" position, the circuit is completed, and current can flow through the diagnostic tool 100. In one example, the rocker switch 112 is disposed before (e.g., closer to the battery pack 104 than) the LED 116 and the positive test lead 120A, such that the rocker switch 112 can regulate the current flowing through the LED 116 and through any component connected to the positive test lead 120A. In other examples, the rocker switch 112 may be disposed elsewhere in the diagnostic tool 100, such as between the LED 116 and the positive test lead 120A or the negative test lead 120B.

The rocker switch 112 may comprise a plurality of switches. For example, the rocker switch 112 may comprise a constant switch (e.g., a switch configured to be closed and to maintain constant contact to enable current flow) and an intermittent switch (e.g., a switch configured to be temporarily or momentarily closed to enable current flow). The constant switch and the intermittent switch may be independent of one another, such that an operator of the diagnostic tool 100 can toggle the constant switch without toggling the intermittent switch, and vice versa. In some cases, the constant switch may be open such that no current flows through the circuit or portions thereof. In such cases, the operator of the diagnostic tool 100 may be able to toggle the intermittent switch to permit current to temporarily flow through the circuit or portions thereof. This may be beneficial, for example, when the operator of the diagnostic tool 100 wishes to provide a temporary or momentary current to the external electrical device (e.g., temporarily energizing a solenoid to ensure the solenoid is functioning properly). In other cases, the operator may be able to depress or otherwise switch the constant switch into an "on" position, in which case current flows through the circuit or a portion thereof. In some examples, when the constant switch is moved to the "on" position, toggling the intermittent switch may not result in any changes to current flow through the circuit or a portion thereof. The toggling of the constant switch may be beneficial, for example, when the operator of the diagnostic tool 100 wishes to provide a prolonged, stable, and/or constant current to the external electrical device (e.g., when performing a pump down of an HVAC system).

The LED 116 may be or comprise any illumination component capable of providing an indicator that current is flowing therethrough. For example, when current flows from the battery pack 104 and through the LED 116, the LED 116 may light up to indicate to the operator that the diagnostic tool 100 is being energized. The luminous intensity (or intensity of light emitted from) of the LED 116 may be proportional to the amount of current flowing therethrough. For example, when the LED 116 is placed in parallel with another current-drawing component such as a test component connected to the positive test lead 120A and the negative test lead 120B, the luminous intensity the LED 116 may decrease. In other words, the LED 116 may be dimmer when the current-drawing component is capable of or is conducting current and brighter when the component cannot draw current or is not drawing current, or vice versa.

To test the functionality of (e.g., to diagnose) an electrical component, the diagnostic tool 100 may be connected to the electrical component via the positive test lead 120A and the negative test lead 120B. In some embodiments, the positive test lead 120A and the negative test lead 120B may be connected to the electrical component while current is prevented from flowing through the diagnostic tool 100 (e.g., the constant and intermittent switches of the rocker switch 112 are in the "off" position) to reduce the likelihood of electric shock to the user. The electrical component may be capable of conducting current into one terminal and out of another terminal thereof. As a result, when the positive test lead 120A and the negative test lead 120B are connected to the terminals of the electrical component and the battery pack 104 generates current, the electrical component may be energized or otherwise draw current therethrough. In the event that the electrical component has an internal short, is damaged, and/or the like, the electrical component may not be able to draw current. In other words, the electrical component may not be able to draw current, or may trip a resettable fuse or breaker, which may indicate that the electrical component under test is damaged or shorted and would need to be replaced.

In some examples, the diagnostic tool 100 may comprise device pairing technology capabilities (e.g., the diagnostic tool 100 comprises wireless Bluetooth® capabilities) which enable the diagnostic tool 100 to be paired or otherwise connected to mobile devices and/or to be integrated into trade applications. In such examples, the diagnostic tool 100 may be controlled wirelessly by an operator of the diagnostic tool 100. For example, the operator of the diagnostic tool 100 may provide inputs into the trade application on his mobile device to control actuation of the rocker switch 112, such as when the operator is performing a pump down in an HVAC system. During the pump down, the wireless activation of the diagnostic tool 100 may enable the operator to monitor the performance of components as the components are actuated without having to manually interact with the rocker switch 112.

Since the LED 116 is connected in parallel to the positive test lead 120A, when the rocker switch 112 is switched to the "on" position the LED 116 may illuminate with an intensity indicative of whether the electrical component is drawing current. In the example shown in FIG. 1A, when the LED 116 generates light at 100% of its possible luminous intensity, the current produced by the battery pack 104 may be flowing entirely through the LED 116 and not through the electrical component. This indicates that the electrical component is not conducting current (which may indicate damage to the electrical component). Alternatively, when the LED 116 does not turn on or generates light at less than 100% of its possible luminous intensity (e.g., 10% luminous intensity, 20% luminous intensity, etc.) the current may be flowing through both the LED 116 and the electrical component. This indicates that the electrical component is conducting current. Stated differently, when the LED 116 turns on at full power, the electrical component is not conducting current; when the LED 116 turns on at less than full power or does not turn on at all, the electrical component is conducting current.

In some examples, the diagnostic tool 100 may comprise additional LEDS, such as a control LED 140, that provide additional visual indicators to the user of the diagnostic tool 100 as to whether the tested electrical component is drawing current. In the example depicted in FIG. 1A, the control LED 140 is positioned, along with a capacitor 144 and a diode 148, in parallel with the battery pack 104. When the rocker switch 112 is actuated, the control LED 140 may illuminate when the electrical component conducts current and may not illuminate when the electrical component does not conduct current. In some examples, the user may use the binary output of the control LED 140 (e.g., on or off) along with the luminous intensity of the LED 116 to determine whether the electrical component conducts current. In some cases, the control LED 140, the capacitor 144, and the diode 148 may be connected after the rocker switch 112, in which case at least one switch associated with the control LED 140 may be switched on before the positive test lead 120A and the positive test lead 120A are connected to the external component (e.g., to charge the capacitor 144).

While the above example uses an increase in luminous intensity of the LED 116 to indicate whether the electrical component conducts current, in other examples a decrease in luminous intensity of the LED 116 may be used to indicate whether the electrical component conducts current. With reference to FIG. 1B, the rocker switch 112 may be disposed between the positive test lead 120A and the positive terminal of the LED 116 instead of between the positive terminal of the LED 116 and the positive terminal of the battery pack 104. In this case, current is constantly running through the LED 116, so the LED 116 generates light at a constant luminous intensity. Once the electrical component is connected and the rocker switch 112 is switched to the "on" position, the electrical component may be able to draw current. As a result, if the LED 116 turns off (or the luminous intensity of the LED 116 otherwise drops), the electrical component may be considered to conduct current. Alternatively, if the luminous intensity of the LED 116 remains constant, the electrical component may be considered to not be drawing current. As previously noted, the lack of current draw by the electrical component may indicate that the electrical component is damaged (e.g., contains one or more internal shorts preventing current from flowing through the electrical component) and/or needs to be replaced.

In some cases, the diagnostic tool 100 may be used to troubleshoot low voltage controls, such as those found in Heating, Ventilation, and Air Conditioning (HVAC) systems. The diagnostic tool 100 may be connected (e.g., via the positive test lead 120A and the negative test lead 120B) to isolated components in the HVAC system such as a contractor, a relay, a solenoid, etc. and the rocker switch 112 may be switched to test the functionality of the isolated component. This enables the user (e.g., a technician or other operator of the diagnostic tool 100) to observe the functionality and reliability of the components and the HVAC system. The diagnostic tool 100 further provides the user with the ability to quickly, efficiently, and safely troubleshoot any low voltage system without needing to activate the entire system while the testing is occurring. The diagnostic tool 100 ensures user safety and reduces the likelihood of system damage during troubleshooting and repair work. In one embodiment, the diagnostic tool 100 is incorporated or integrated into a handheld device, such as a multimeter. In such an embodiment, the diagnostic tool 100 may be a setting or use option of the handheld device, such that a user or operator of the multimeter can switch the multimeter to a preset mode that implements the diagnostic tool 100 to test the conductivity of an electrical component external to the handheld device.

In some cases, the diagnostic tool 100 may comprise one or more safety mechanisms (e.g., fuses) to minimize the likelihood of damage to electrical components and/or to protect the operator from exposure to electric shock. For example, the diagnostic tool 100 may comprise one or more fuses 132 positioned at various locations in the circuit to provide overcurrent protection. In other words, the fuse(s) 132 may be designed to stop current flow in the circuit (or one or more sections thereof) when the fuse experiences excess current. The excess current may occur, for example, when the electrical component being tested is shorted, or in cases of operator error (e.g., the operator accidently shorts one or more portions of the diagnostic tool 100 by contacting the positive test lead 120A and the negative test lead 120B together while the battery pack 104 is generating current). The fuses 132 may be resettable or replaceable, such that the operator can respectively reset the fuse or switch out a spent fuse for a new one once the fuse is blown.

In some cases, the diagnostic tool 100 may enable the operator to switch the power source (e.g., the battery pack 104) from DC to AC (or vice versa), depending on the type of component being tested by the diagnostic tool 100. For example, when the battery pack 104 generates alternating current and the electrical component being tested requires direct current, an AC to DC converter 128 may be positioned between the battery pack 104 and the test component, such that AC current output from the battery pack 104 may be converted to DC current before passing into the electrical component. Conversely, when the battery pack 104 generates direct current and the electrical component being tested requires alternating current, a DC to AC converter 128 may be positioned between the battery pack 104 and the test component, such that the DC current output by the battery pack 104 is converted to AC current before passing into the electrical component. It is to be understood that, while the AC to DC (or DC to AC) converter 128 is illustrated in FIGS. 1A-1B as being positioned between the rocker switch 112 and the positive test lead 120A, the converter 128 may be positioned in alternative locations within the diagnostic tool 100.

In some embodiments, the diagnostic tool 100 may comprise one or more overvoltage protectors 136 or similar components that disable the diagnostic tool 100 when the diagnostic tool 100 interacts with an electrical component in a high voltage setting (e.g., voltage greater than 1 kilovolt (kV), voltage greater than 500 kV, voltage greater than 100 kV, voltage greater than 50 kV, voltage greater than 10 kV, voltage between 90 Volts (V) and 240 V, etc.). The overvoltage protectors 136 may be triggered, for example, when the operator mistakenly connects the diagnostic tool 100 to an electrical component that requires high voltage, or when the diagnostic tool 100 outputs a high voltage relative to the requirements of the electrical component (e.g., the battery pack 104 generates a high voltage that exceeds the operating range of the electrical component). The overvoltage protector 136 may be a circuit component disposed between the battery pack 104 and the electrical component, and may cutoff the input voltage supply when the input voltage exceeds a threshold voltage value. In some cases, the threshold voltage value may be predetermined based on the inherent properties of the overvoltage protector 136, but in other embodiments may be adjustable by the operator. It is to be understood that, while the overvoltage protector 136 is illustrated in FIGS. 1A-1B as being positioned between the negative test lead 120B and the LED 116, the overvoltage protector 136 may be disposed in alternative locations within the diagnostic tool 100.

Figure 2:
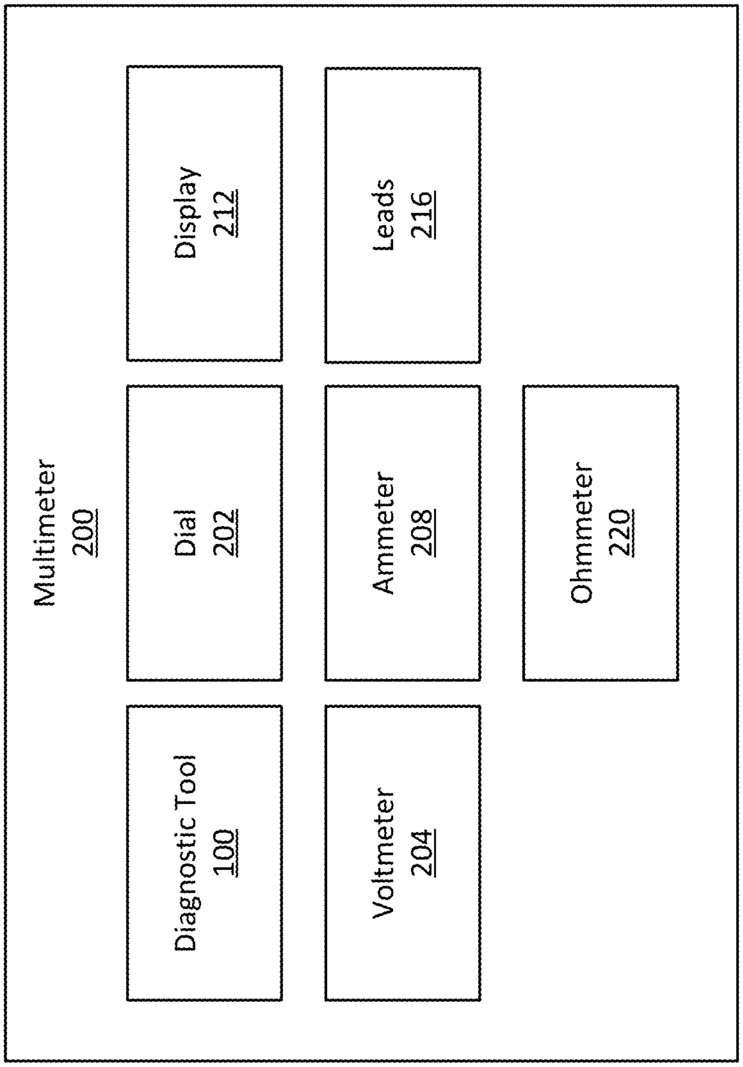
FIG. 2 is a block diagram of aspects of a multimeter in accordance with embodiments of the present disclosure.

With reference to FIG. 2, a block diagram depicting aspects of a multimeter 200 according to at least one embodiment of the present disclosure is shown. The multimeter 200 comprises the diagnostic tool 100, a dial 202, a voltmeter 204, an ammeter 208, a display 212, leads 216, and an ohmmeter 220. The multimeter 200 may be or comprise a digital multimeter, a handheld multimeter, a handheld digital multimeter, an advanced digital multimeter, and/or a compact digital multimeter. In some cases, the diagnostic tool 100, the voltmeter 204, the ammeter 208, and/or the ohmmeter 220 may be combined into a single operative component. In some cases, the multimeter 200 may be a digital multimeter in which one or more components of the diagnostic tool 100 the voltmeter 204, the ammeter 208, and/or the ohmmeter 220 are provided as an embedded computer (e.g., a computer processor, computer memory, one or more digital signal processors, etc.) that converts the signal under test to a voltage and preconditions the signal using electronically controlled gain. In other words, the multimeter 200 may comprise software and/or digital components as opposed to separate, physical analog circuits.

In some cases, the multimeter 200 may be or comprise a system or device for testing electrical components, such as a conventional multimeter, testing equipment, handheld device, and/or the like. In such cases, the diagnostic tool 100 may be a component or part of the multimeter 200. It is to be understood that the multimeter 200 may comprise additional or alternative components than those depicted in FIG. 2. For example, the multimeter 200 may comprise additional components for measuring or detecting other values (e.g., measuring temperature, measuring transistor gain, etc.). As another example, the multimeter 200 may omit other components, such as the ohmmeter 220.

The dial 202 may be a physical or virtual component that enables the user of the multimeter 200 to change one or more settings or modes under which the multimeter 200 functions. In some cases, the dial 202 may be a physical dial rotatable by the user to change the multimeter 200 from operating as a voltmeter to operating as an ammeter. In other cases, the dial 202 may be a virtual menu rendered to the display 212 from which the user can select the operating mode of the multimeter 200.

The voltmeter 204 may be or comprise a device that can measure the voltage in electrical circuits or other electrical components (e.g., a resistor). In some cases, the voltmeter 204 may be used when a user of the multimeter 200 wishes to determine the voltage across two points in an electrical circuit. The user may switch the multimeter 200 into a voltage mode by turning the dial 202 to the appropriate setting, and then by placing the leads 216 on various positions on the electrical component. The measured voltage may then be shown on the display 212. The ammeter 208 may be or comprise a device that can measure the current passing through an electrical circuit or component (e.g., a resistor). The user may use the ammeter 208 to measure the current by turning the dial 202 to the appropriate setting to enable the multimeter 200 to measure current. The leads 216 may then be connected to the electrical circuit or component and the measured current may be shown on the display 212. The ohmmeter 220 may be or comprise a device that can measure the resistance of a component in an electrical circuit, such as a resistor, capacitor, inductor, and/or the like. The user may enable the ohmmeter 220 by positioning the dial 202 on the appropriate setting to enable the multimeter 200 to measure the resistance. The leads 216 may then be connected to the component to measure the resistance thereof. The measured resistance may be shown on the display 212.

The leads 216 may connect the multimeter 200 to an external device. In some embodiments, the leads 216 may be similar to or the same as the positive test lead 120A and the negative test lead 120B. The leads 216 may be or comprise test probes, crocodile clips, retractable hook clips, tweezer probes, and/or the like that enable the leads 216 to electrically connect the multimeter 200 with one or more devices or components external to the multimeter 200.

The display 212 may be or comprise a screen or other device on which information related to the multimeter 200 is rendered. The user of the multimeter 200 may be able to provide inputs into the multimeter 200 via the display 212 (e.g., via a touch screen). The display 212 may display the current setting of the multimeter 200 based on, for example, the position of the dial 202. In some cases, measurements generated by the diagnostic tool 100, the voltmeter 204, the ammeter 208, the ohmmeter 220, and/or any other measurement tool of the multimeter 200 may be rendered to the display 212. For example, the diagnostic tool 100 may be used to test the functionality of an electrical component and the results of the test, such as a visual indicator as to whether the electrical component conducts current and/or an amp draw value, may be rendered to the display 212. Additionally or alternatively, the feedback from the multimeter 200 may be or comprise haptic indicator(s) (e.g., vibration motors in the multimeter 200 may be actuated when the electrical component conducts current), audio indicator(s) (e.g., a device generates a beeping noise when the electrical component conducts current), combinations thereof, and/or the like. Alternatively, the multimeter 200 may be configured such that visual, haptic, and/or audio indicators are delivered when the electrical component does not conduct current.

Figure 3:
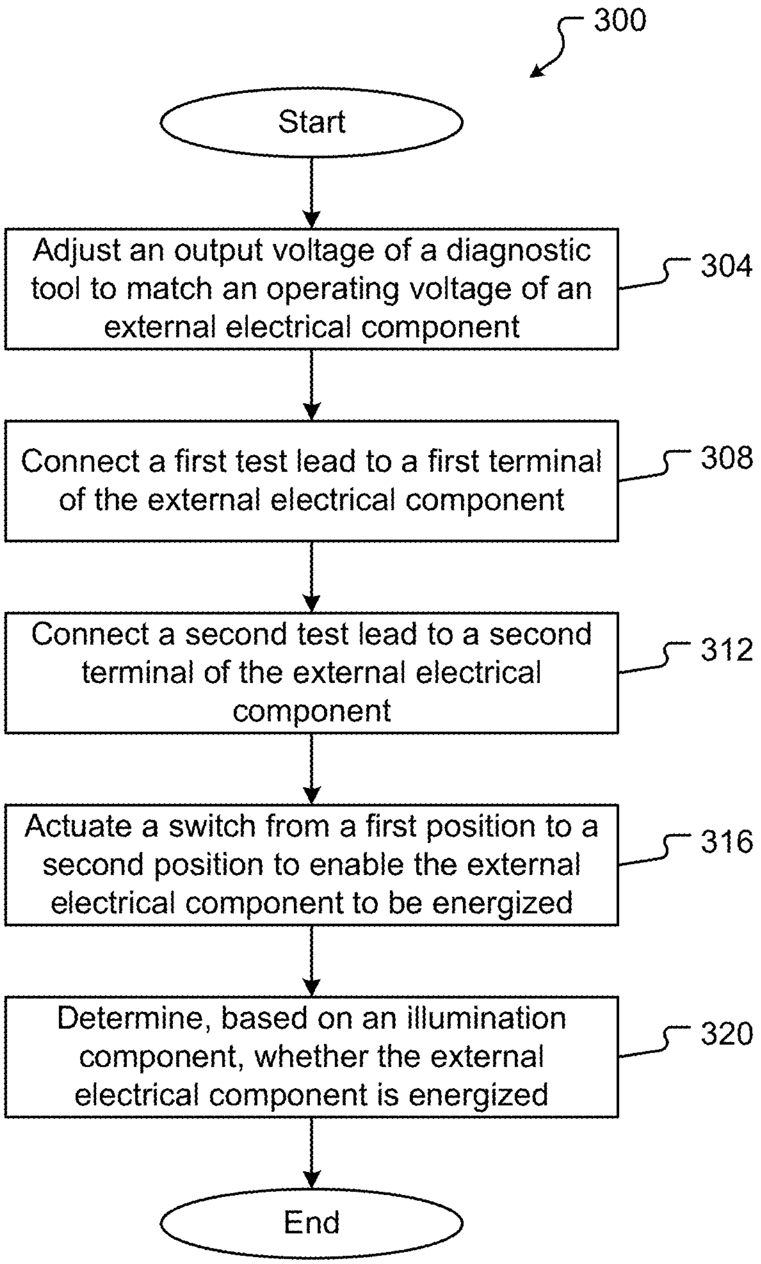
FIG. 3 is a flowchart in accordance with embodiments of the present disclosure.

FIG. 3 is a flowchart depicting a method 300 for using a diagnostic tool to energize an external electrical component and determine if the external electrical component conducts current in accordance with embodiments of the present disclosure.

The method 300 starts and then proceeds to step 304, where an output voltage of a diagnostic tool (e.g., diagnostic tool 100) is adjusted to match or meet an operating voltage of an external electrical component. For example, in the context of HVAC systems, the operating voltage of the external electrical component may be about 24 volts. The output voltage of the diagnostic tool may be changed by the user such that the output voltage of the diagnostic tool is about 24 volts. In one example, the user may change the output voltage by actuating one or more dials or switches to electrically connect additional batteries (or alternatively electrically disconnect batteries) from the power source of the diagnostic tool to change the overall output voltage of the diagnostic tool to be about 24 volts. In another example, the power source of the diagnostic tool may comprise an adjustable internal voltage, and the user may change the internal voltage of the power source such that the diagnostic tool operates at about 24 volts. In some cases, such as when the diagnostic tool is integrated into a multimeter or other device, the voltage setting of the diagnostic tool may rendered to the display 212. While an HVAC component is provided as an example above, it is to be understood that the operating voltage of the external electrical component may be a different voltage (e.g., 6 volts, 9 volts, 12 volts, etc.) and the output voltage of the diagnostic tool may be adjusted accordingly. In some cases, the voltage of the diagnostic tool may be a fixed voltage, such that an operator of the diagnostic tool need not adjust the voltage of the diagnostic tool.

The method 300 then continues to step 308, where a first test lead is connected to a first terminal of an external electrical component. One end of the first test lead (e.g., positive lead 124A, leads 216, etc.) may be connected to a power source (e.g., the battery pack 104) of the diagnostic tool 100, while the other end of the first test lead may be connected to the first terminal of the external electrical component. In some cases, such as when the diagnostic tool 100 is a component of the multimeter 200 or other handheld tool/device, the first test lead may be a lead of the multimeter 200.

The method 300 then continues to step 312, where a second test lead is connected to a second terminal of the external electrical component. One end of the second test lead (e.g., negative lead 124B, leads 216, etc.) may be connected to the power source of the diagnostic tool 100, while the other end of the second test lead may be connected to the second terminal of the external electrical component. In some cases, such as when the diagnostic tool 100 is a component of the multimeter 200 or other handheld tool/device, the second test lead may be a lead of the multimeter 200. The connection of the second test lead to the second terminal of the external electrical component, along with the connection of the first test lead to the first terminal of the external electrical component, may enable current to flow from the power source of the diagnostic tool 100 through the external electrical component.

The method 300 then continues to step 316, where a switch is actuated from a first position to a second position to enable the external electrical component to be energized. The switch (e.g., rocker switch 112) of the diagnostic tool 100 may be moved from an “off” position to an “on” position to permit current to flow from the power source of the diagnostic tool 100 to the external electrical component.

In cases where the diagnostic tool 100 comprises device pair technology, the diagnostic tool 100 may be controlled and monitored via a trade application or other third-party application on a mobile device. For example, a third-party application may be used to monitor voltage, amp draw, switch functionality and/or state (e.g., switched on or off), combinations thereof, and/or the like as the diagnostic tool 100 is used. The use of the device pairing technology may enable an operator of the diagnostic tool 100 to energize a component via a mobile device while monitoring system performance (e.g., refrigerant pressures, clamp meter amps, etc.) via the trade application. The use of the trade application may beneficially enhance the operator’s ability to troubleshoot stuck solenoids or reversing valves. The mobile applications may also comprise pump down options to cause the diagnostic tool 100 to energize a compressor contact to perform a pump down. While in a pump down operation, the diagnostic tool 100 may energize the compressor and the trade application may provide pressure readings that can be used to monitor the system. When the desired pressure is reached, the mobile application may disable current flow in the diagnostic tool 100 (e.g., by wirelessly switching the rocker switch 112 to an “off” position) to prevent or mitigate the likelihood of damage to the compressor. Additionally, the use of the trade application may enable hands-free pump downs, which may help ensure operator safety.

The method 300 then continues to step 320, where an illumination component is used to determine if the external electrical component is energized. After the rocker switch is actuated, the battery pack or other power source of the diagnostic tool 100 may energize the external electrical component to actuate one or more functions of the external electrical component (e.g., a relay is switched on, a contactor is pulled in, a solenoid is opened or closed, a reversing valve is shifted, etc.). The illumination component (e.g., LED 116) may be electrically connected to both the battery pack and, when the switch is actuated, to the external electrical component under test. When the diagnostic tool 100 generates current, the external electrical component may draw current which may reduce the luminous intensity of the illumination component. For example, the illumination component may be connected in parallel to the external electrical component, such that when the external electrical component draws current the luminous intensity of the illumination component decreases. In cases where the external electrical component does not draw current (e.g., the external electrical component is damaged), the luminous intensity of the illumination component may remain approximately the same.

In one example, such as when the diagnostic tool 100 is integrated into the multimeter 200, the illumination component may be replaced by a visual rendering to the display 212 of the multimeter 200 to inform the user of the multimeter 200 as to whether the external electrical component conducts current. In this example, a first indicator (e.g., a green light, the word “functional”, etc.) may be rendered to the display 212 when the external electrical component draws current, and a second, different indicator (e.g., a red light, the words “not functional”, etc.) may be rendered to the display 212 when the external electrical component does not draw current.

The method 300 then ends. In some cases, the method 300 may then repeat by, for example, repeating the steps of the method 300 with a different external electrical component, such as when a user is testing more than one electrical component (e.g., different electrical components in an HVAC system). In other words, the user may connect the diagnostic tool 100 (which may be a separate unit or incorporated as a part of a multimeter or other handheld device) to multiple different electrical components to determine whether each electrical component can conduct current.

Any of the steps, functions, and operations discussed herein can be performed continuously and automatically.

The exemplary systems and methods of this disclosure have been described in relation to an electrical component diagnostic tool. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving case, and/or reducing cost of implementation.

The foregoing discussion of the disclosure has been presented for purposes of illustration and description. The foregoing is not intended to limit the disclosure to the form or forms disclosed herein. In the foregoing Detailed Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Detailed Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Example aspects of the present disclosure include:

A device according to at least one embodiment of the present disclosure comprises: an electrical power source; an illumination component electrically connected to the electrical power source; a first test lead electrically connected to the electrical power source and capable of being electrically connected to a first terminal of an external electrical component; a second test lead electrically connected to the electrical power source and capable of being electrically connected to a second terminal of the external electrical component; and a switch positioned between the electrical power source and at least one of the first test lead and the second test lead and movable between a first position and a second position to permit current from the electrical power source to flow through the at least one of the first test lead and the second test lead.

Any of the aspects herein, wherein an output voltage of the device is adjustable to match an operating voltage of the external electrical component.

Any of the aspects herein, wherein the switch is positioned between a terminal of the electrical power source and a terminal of the illumination component.

Any of the aspects herein, wherein the switch is positioned between a terminal of the illumination component and the first test lead.

Any of the aspects herein, further comprising: a charging port capable of connecting the electrical power source to an external charging system.

Any of the aspects herein, wherein the electrical power source comprises one or more batteries.

Any of the aspects herein, further comprising a fuse.

Any of the aspects herein, further comprising a converter configured to at least one of convert alternating current to direct current and convert direct current to alternating current.

A method for using a diagnostic tool to test an external electrical component according to at least one embodiment of the present disclosure comprises: providing the diagnostic tool, the diagnostic tool including an electrical power source and an illumination component electrically connected to the electrical power source; connecting a first test lead connected to the electrical power source to a first terminal of the external electrical component; connecting a second test lead connected to the electrical power source to a second terminal of the external electrical component; and actuating a switch of the diagnostic tool from a first position to a second position, wherein the switch is positioned between the electrical power source and at least one of the first test lead and the second test lead, and wherein the switching enables current to flow from the electrical power source through the external electrical component.

Any of the aspects herein, wherein an output voltage of the electrical power source is adjusted to meet an operating voltage of the external electrical component.

Any of the aspects herein, wherein the illumination component indicates whether the external electrical component is being energized based on a luminous intensity of the illumination component.

Any of the aspects herein, wherein the switch is positioned between a terminal of the electrical power source and a terminal of the illumination component.

Any of the aspects herein, wherein the switch is positioned between a terminal of the illumination component and the first test lead.

Any of the aspects herein, wherein the electrical power source comprises one or more batteries.

Any of the aspects herein, wherein the diagnostic tool comprises a converter that converts at least one of alternating current to direct current and alternating current to direct current.

A system according to at least one embodiment of the present disclosure comprises: a power source; a first test lead electrically connectable to the power source and to a first terminal of an external electrical component; a second test lead electrically connectable to the power source and to a second terminal of the external electrical component; and a diagnostic tool, comprising: a switch positioned between the power source and at least one of the first test lead and the second test lead and movable between a first position and a second position to permit current from the power source to flow through the external electrical component.

Any of the aspects herein, wherein the power source comprises one or more batteries.

Any of the aspects herein, wherein the power source is adjustable such that a voltage output of the power source is about an operating voltage of the external electrical component.

Any of the aspects herein, further comprising an illumination component that indicates, based on a luminous intensity, whether the external electrical component is energized.

Any of the aspects herein, wherein the switch is positioned between a terminal of the power source and a terminal of the illumination component.

Any of the aspects herein, wherein the switch is positioned between a terminal of the illumination component and the first test lead.

Any of the aspects herein, further comprising a charging port capable of connecting the power source to an external charging system.

Any of the aspects herein, further comprising a converter configured to at least one of convert alternating current to direct current and convert direct current to alternating current.

Any aspect in combination with any one or more other aspects.

Any one or more of the features disclosed herein.

Any one or more of the features as substantially disclosed herein.

Any one or more of the features as substantially disclosed herein in combination with any one or more other features as substantially disclosed herein.

Any one of the aspects/feature/embodiments in combination with any one or more other aspects/features/embodiments.

Use of any one or more of the aspects or features as disclosed herein.

It is to be appreciated that any feature described herein can be claimed in combination with any other feature(s) as described herein, regardless of whether the features come from the same described embodiment.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

Aspects of the present disclosure may take the form of an embodiment that is entirely hardware, an embodiment that is entirely software (including firmware, resident software, micro-code, etc.) or an embodiment combining software and hardware aspects that may all generally be referred to herein as a "circuit," "module," or "system." Any combination of one or more computer-readable medium(s) may be utilized. The computer-readable medium may be a computer-readable signal medium or a computer-readable storage medium.

A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable medium may be transmitted using any appropriate medium, including, but not limited to, wireless, wireline, optical fiber cable, RF, etc., or any suitable combination of the foregoing.

The terms "determine," "calculate," "compute," and variations thereof, as used herein, are used interchangeably and include any type of methodology, process, mathematical operation or technique.

What is claimed is:

1. A device, comprising:

an electrical power source;

an illumination component wired in parallel with the electrical power source;

a first test lead with a first end electrically connected to a first terminal of the electrical power source and a first terminal of the illumination component, wherein a second end of the first test lead is capable of being electrically connected to a first terminal of an external electrical component;

a second test lead with a first end electrically connected to a second terminal of the electrical power source and a second terminal of the illumination component, wherein a second end of the second test lead is capable of being electrically connected to a second terminal of the external electrical component; and a switch positioned between either the first terminal of the electrical power source and the second end of the first test lead or the second terminal of the electrical power source and the second end of the second test lead and movable between a first position and a second position to permit current from the electrical power source to flow through at least one of the first test lead and the second test lead.

2. The device of claim 1, wherein an output voltage of the device is adjustable to match an operating voltage of the external electrical component.

3. The device of claim 1, wherein the switch is positioned between the first terminal of the electrical power source and the first terminal of the illumination component.

4. The device of claim 1, wherein the switch is positioned between the first terminal of the illumination component and the first end of the first test lead.

5. The device of claim 1, further comprising:

a charging port capable of connecting the electrical power source to an external charging system.

6. The device of claim 1, further comprising a fuse.

7. The device of claim 1, further comprising a converter configured to at least one of convert alternating current to direct current and convert direct current to alternating current.

8. A method for using a diagnostic tool to test an external electrical component, the method comprising:

providing the diagnostic tool, the diagnostic tool including an electrical power source and an illumination component that is wired in series with a capacitor and a diode, and wired in parallel with the electrical power source;

connecting a first end of a first test lead to a first terminal of the external electrical component, wherein a second end of the first test lead opposite the first end is electrically connected to a first terminal of the electrical power source and a first terminal of the illumination component;

connecting a first end of a second test lead to a second terminal of the external electrical component, wherein a second end of the second test lead opposite the first end is electrically connected to a second terminal of the electrical power source and a second terminal of the illumination component; and actuating a switch of the diagnostic tool from an open position to a closed position, wherein the switch is positioned between either the first terminal of the electrical power source and the first end of the first test lead or the second terminal of the electrical power source and the first end of the second test lead, and wherein actuating the switch enables current to flow from the electrical power source through the external electrical component.

9. The method of claim 8, wherein an output voltage of the electrical power source is adjusted to meet an operating voltage of the external electrical component.

10. The method of claim 8, wherein the illumination component indicates whether the external electrical component is being energized based on a luminous intensity of the illumination component.

11. The method of claim 8, wherein the switch is positioned between the first terminal of the electrical power source and the first terminal of the illumination component.

12. The method of claim 8, wherein the switch is positioned between the first terminal of the illumination component and the second end of the first test lead.

13. The method of claim 8, wherein the diagnostic tool comprises a converter that converts at least one of alternating current to direct current and direct current to alternating current.

14. A system, comprising:

a power source;

an illumination component wired in parallel with the power source;

a second illumination component wired in parallel with the power source;

a capacitor wired in series with the second illumination component;

a diode wired in series with the capacitor and the second illumination component;

a battery meter wired in parallel with the power source;

a first test lead with a first end that is electrically connectable to a first terminal of the power source and a second end that is electrically connectable to a first terminal of an external electrical component;

a second test lead with a first end that is electrically connectable to a second terminal of the power source and a second end that is electrically connectable to a second terminal of the external electrical component;

an overvoltage protector positioned between the power source and the external electrical component; and a switch positioned between the first terminal of the illumination component and the first end of the first test lead and movable between an open position and a closed position to permit current from the power source to flow through the external electrical component, wherein the illumination component is connected in parallel with the external electrical component upon the first test lead and the second test lead being connected to the external electrical component, wherein the second illumination component is switched on before the first test lead and the second test lead are connected to the external electrical component to charge the capacitor, and wherein, when the switch is in the closed position, a luminous intensity of the illumination component decreases when the external electrical component draws current from the power source.

15. The system of claim 14, wherein the power source is adjustable such that a voltage output of the power source is about an operating voltage of the external electrical component.

16. The system of claim 14, further comprising a charging port capable of connecting the power source to an external charging system.

17. The system of claim 14, further comprising a converter configured to at least one of convert alternating current to direct current and convert direct current to alternating current.

18. The system of claim 14, wherein, when the switch is in the closed position, the luminous intensity of the illumination component remains constant when the external electrical component does not draw current from the power source.

19. The system of claim 14, wherein the overvoltage protector cuts off current flow through the illumination component when an input voltage from the external electrical component exceeds a threshold voltage value.

* * * * *